United States Patent
Zhao

(10) Patent No.: US 10,059,077 B2
(45) Date of Patent: Aug. 28, 2018

(54) HIGH RESISTANCE PANELS (HRP)

(71) Applicant: Joe Ru He Zhao, Vancouver (CA)

(72) Inventor: Joe Ru He Zhao, Vancouver (CA)

( * ) Notice: Subject to any disclaimer, the term of this patent is extended or adjusted under 35 U.S.C. 154(b) by 423 days.

(21) Appl. No.: 14/586,975

(22) Filed: Dec. 31, 2014

(65) Prior Publication Data

US 2016/0185069 A1 Jun. 30, 2016

(51) Int. Cl.
| | |
|---|---|
| *B32B 3/12* | (2006.01) |
| *B32B 15/04* | (2006.01) |
| *B32B 7/12* | (2006.01) |
| *B32B 5/02* | (2006.01) |
| *C30B 29/22* | (2006.01) |

(Continued)

(52) U.S. Cl.
CPC ............ *B32B 3/12* (2013.01); *B32B 5/02* (2013.01); *B32B 7/12* (2013.01); *B32B 15/043* (2013.01); *B32B 15/14* (2013.01); *B32B 15/20* (2013.01); *B32B 19/041* (2013.01); *B32B 19/045* (2013.01); *B32B 27/08* (2013.01); *B32B 27/10* (2013.01); *C30B 9/04* (2013.01); *C30B 9/12* (2013.01); *C30B 11/00* (2013.01); *C30B 29/12* (2013.01); *C30B 29/22* (2013.01); *C30B 29/68* (2013.01); *E04B 1/00* (2013.01); *B32B 2250/40* (2013.01); *B32B 2250/42* (2013.01); *B32B 2255/06* (2013.01); *B32B 2255/10* (2013.01); *B32B 2255/20* (2013.01); *B32B 2255/205* (2013.01); *B32B 2255/26* (2013.01); *B32B 2260/021* (2013.01); *B32B 2260/046* (2013.01); *B32B 2262/02* (2013.01); *B32B 2262/06* (2013.01); *B32B 2262/101* (2013.01); *B32B 2262/108* (2013.01); *B32B 2262/14* (2013.01); *B32B 2264/102* (2013.01); *B32B 2264/12* (2013.01); *B32B 2307/30* (2013.01); *B32B 2307/304* (2013.01); *B32B 2307/306* (2013.01); *B32B 2307/412* (2013.01); *B32B 2307/58* (2013.01); *B32B 2307/704* (2013.01); *B32B 2307/72* (2013.01); *B32B 2307/7242* (2013.01);

(Continued)

(58) Field of Classification Search
None
See application file for complete search history.

(56) References Cited

U.S. PATENT DOCUMENTS

| | | |
|---|---|---|
| 4,444,821 A | 4/1984 | Young et al. |
| 4,529,638 A | 7/1985 | Yamamoto et al. |

(Continued)

FOREIGN PATENT DOCUMENTS

CN 202781973 U * 3/2013

OTHER PUBLICATIONS

Jeremy Hsu, Nanocrystals Create an Insulator Better Than Pure Vacuum, Popular Science (Dec. 14, 2009), http://www.popsci.com/technology/article/2009-12/photonic-crystals-beat-plain-old-vacuum-insulation.*

*Primary Examiner* — Nicholas W. Jordan

(57) ABSTRACT

A thermal insulation panel is consist of an impermeable barrier and backing, a surface of low emissivity, an adhesive, a mixture of phononic cocrystals at both sides, and a support material in a honeycomb structure in between two sides. The panel reduces heat transfer and has an overall thermal conductivity in order of $10^{-3}$ w/(m·K), and a density of 20-100 kg/m$^3$. The panel can be cut to any sizes to meet requirements for installation, and can be stacked or piled up to meet the requirements of thickness and thermal resistance in application.

16 Claims, 4 Drawing Sheets

(51) Int. Cl.
  *C30B 29/68* (2006.01)
  *C30B 29/12* (2006.01)
  *C30B 9/04* (2006.01)
  *C30B 9/12* (2006.01)
  *C30B 11/00* (2006.01)
  *B32B 15/14* (2006.01)
  *B32B 15/20* (2006.01)
  *B32B 19/04* (2006.01)
  *B32B 27/08* (2006.01)
  *B32B 27/10* (2006.01)
  *E04B 1/00* (2006.01)

(52) U.S. Cl.
  CPC ..... *B32B 2307/732* (2013.01); *B32B 2419/04* (2013.01); *B32B 2607/02* (2013.01)

(56) References Cited

U.S. PATENT DOCUMENTS

| | | |
|---|---|---|
| 4,726,974 A | 2/1988 | Nowobilski et al. |
| 5,648,508 A | 7/1997 | Yaghi |
| 7,449,227 B2 | 11/2008 | Echigoya et al. |
| 7,517,576 B2 | 4/2009 | Echigoya et al. |
| 7,838,098 B2 | 11/2010 | Kim et al. |
| 7,968,159 B2 | 6/2011 | Feinerman |
| 8,137,784 B2 | 3/2012 | Veltkamp |
| 8,281,558 B2 | 10/2012 | Hiemeyer et al. |
| 8,377,538 B2 | 2/2013 | Eberhardt et al. |
| 8,383,225 B2 | 2/2013 | Rotter |
| 8,475,893 B2 | 7/2013 | Feinerman |
| 8,647,417 B2 | 2/2014 | Eisenhardt et al. |
| 8,663,773 B2 | 3/2014 | Jang et al. |
| 2007/0286981 A1* | 12/2007 | Feinerman ............... B32B 1/04 428/69 |
| 2008/0307729 A1* | 12/2008 | Maimon ............... E04C 2/3405 52/745.19 |
| 2010/0270492 A1* | 10/2010 | Zhao .................... C09K 5/063 252/67 |
| 2011/0266088 A1* | 11/2011 | Koike .................... B32B 3/12 181/290 |
| 2012/0031957 A1* | 2/2012 | Whitaker ................ B32B 3/12 428/116 |
| 2016/0306084 A1* | 10/2016 | Padiyath ............... G02B 5/208 |

* cited by examiner

HIGH RESISTANCE PANELS (HRP)

FIELD OF THE INVENTION

The present invention relates to high resistance panels (HRP) used for thermal insulation and a method of manufacturing the same.

BACKGROUND OF THE INVENTION

Heat transfers by three mechanisms: conduction, convection, and radiation. Conduction is the molecule to molecule transfer of kinetic energy. Convection is the transfer of heat by physically moving the molecules from one place to another. Radiation is the transfer of heat through a space between two objects via electromagnetic waves.

The heat flow through solid materials is mainly by conduction. In stable heat transfer, the resistance to heat flow through solid materials can be described by $$Q=(T_1-T_2)/R \quad (1)$$

Where Q is heat flow per unit area, in w/m² (Systeme International Unit), $T_1$ is the higher temperature, in K, $T_2$ is the lower temperature, in K, R is heat resistance, R-Value, in m²·K/w, defined as $$R=l/\lambda \quad (2)$$

Where l is the thickness of material which heat transfers through, in m, and $\lambda$ is thermal conductivity of the material, in w/(m·K), which can be found in the prior art.

In SI unit, an R-Value such as 5.5 may be indicated as RSI5.5. In non-SI unit, as an imperial unit, R-Value uses ft²·°F·hr/Btu. The conversion between non-SI and SI is: 1 ft²·°F·hr/Btu=0.1762 m²·K/w. Thus, RSI5.5=R31.2.

The higher the R-Value of a material, the better it is to resist heat flow. R-Value of a material is measured in test laboratories. Heat flow through the layer of a material can be determined by keeping one side of the material at a constant higher temperature, for example, 90° F. (32° C.), and measuring how much supplemental energy is required to keep the other side of the material at a constant lower temperature, for example, 50° F. (10° C.). Then the R-Value can be obtained from Equation (1).

Heat transfers in liquids (air, gases, water, etc.) also by convection. In stable status, heat flux by convection can be expressed as $$Q=h(T_1-T_2) \quad (3)$$

Where h is heat transfer coefficient of convection, in w/(m²·K).

Heat convection is a combination of diffusion and bulk motion of molecules. Near the surface the fluid velocity is low, and diffusion dominates. Away from the surface, bulk motion increases the influence and dominates. Heat convection may take the form of either forced convection or natural convection. Forced convection occurs when a fluid flow is induced by an external force, such as a pump, a fan or a mixer. Natural convection is caused by buoyancy forces due to density differences caused by temperature variations in the fluid. At heating the density change in the boundary layer will cause the fluid to rise and be replaced by cooler fluid that also will heat and rise. Boiling or condensing processes are also referred as heat convection.

Heat transfer coefficient of convection h is dependent on the type of fluids, the flow properties such as velocity, viscosity and other flow and temperature dependent properties. Heat transfer coefficients of convection h can be found in the prior art.

Heat flux by radiation via a space between two objects can be expressed as $$Q=\epsilon\sigma(T_1^4-T_2^4) \quad (4)$$

Where $\epsilon$ is the emissivity of the surface, and $\sigma$ is the Stefan-Boltzmann constant, $5.67037\times10^{-8}$ w/(m²·K⁴).

Thermal radiation is the emission of electromagnetic waves from all matter that has a temperature greater than absolute zero. It represents a conversion of thermal energy into electromagnetic energy. Thermal energy results in kinetic energy in the random movements of atoms and molecules in matter. All matter with a temperature by definition is composed of particles which have kinetic energy, and which interact with each other. These atoms and molecules are composed of charged particles, protons and electrons, and kinetic interactions among matter particles result in charge-acceleration and dipole-oscillation. This results in the electrodynamic generation of coupled electric and magnetic fields, resulting in the emission of photons, radiating energy away from the body through its surface boundary. Electromagnetic radiation does not require the presence of matter to propagate and travels in the vacuum of space infinitely far if unobstructed.

The characteristics of thermal radiation depend on various properties of the surface it is emanating from, including temperature, spectral absorptivity and spectral emissive power.

Thermal radiation in a space within optical depth (for most insulation materials) is propagating via diffusion. A simple expression for conductivity of radiation can be used as follows $$\lambda_r=c\, T^3/E \quad (5)$$

Where $\lambda_r$ is thermal conductivity of radiation, in w/(m·K), c is constant related to material, radiation energy, etc., in w/(m²·K⁴), T is absolute temperature, in K, and E is extinction coefficient, in 1/m, can be expressed as $$E=1/d=\rho e \quad (6)$$

Where d is the mean free path of the radiation photons, in m, $\rho$ is density of material, in kg/m³, and e is mass specific extinction, in m²/kg.

The development of insulation materials is to make efforts to reduce heat transfer by conduction, convection and radiation. Most insulation materials have been developed before 1950s, but the extensive application of thermal insulation started after the oil crisis in 1970s. Since the oil crisis, thermal insulation of buildings has become the key issue to prevent heat loss and to improve energy efficiency. The traditional thermal insulation takes air as the best insulator. The thermal conductivity of air of 0.024 w/(m·K) sets the limit of performance for such insulation materials. Presently, only vacuum technology in combination with microporous structures can achieve the thermal conductivity of less than 0.024 w/(m·K), that is, Vacuum Insulation Panels (VIP).

In conventional insulation materials, such as fiberglass, foams, etc., three heat transfer mechanisms are required to consider. Heat transfer in gases (or air) by convection and conduction may be taken as a combination, being a thermal conductivity $\lambda_g$. The overall thermal conductivity $\lambda$ of an insulation material can be given as $$\lambda=\lambda_g+\lambda_s+\lambda_r \quad (7)$$

Where $\lambda_g$ is thermal conductivity of gases (or air) in pores combining heat conduction and convection, in w/(m·K), $\lambda_s$ is thermal conductivity of the solid, in w/(m·K), and $\lambda_r$ is thermal conductivity by radiation, in w/(m·K).

Normal insulation materials have typical overall thermal conductivity of 0.035 to 0.06 w/(m·K). To reduce overall thermal conductivity of insulation materials, VIP has been developed. VIP is to reduce $\lambda_g$ and $\lambda_r$. VIP is a form of thermal insulation consisting of a nearly gas-tight enclosure surrounding a rigid core, from which the air has been evacuated. VIP consists of three main components:

(1) Walls: membrane walls or enclosures, used to prevent gases (or air) from entering the panel.

(2) Core: a panel of a rigid, highly-porous material, such as fumed silica, aerogel, perlite or fibres (glass fibres, mineral wool, etc.), to support the walls against atmospheric pressure once the air is evacuated.

(3) Getter: to collect gases (or air) leaked through the walls or offgassed from the core and wall materials.

Heat convection relies on the presence of gas molecules able to transfer heat energy by bulk movement through the insulator. Vacuum can reduce heat convection. Vacuum also greatly reduces heat conduction of gases (or air), as there are far fewer collisions between adjacent gas molecules, or between gas molecules and atoms of the core material.

Since the core material in a VIP is similar in thermal characteristics to materials used in conventional insulation, VIP therefore achieves a much lower thermal conductivity than conventional insulation materials. VIP is claimed to achieve an overall thermal conductivity of 0.004 w/(m·K) across the centre of the VIP, or an overall thermal conductivity of 0.006-0.008 w/(m·K) after allowing for thermal bridging across the VIP edges.

Core materials used in VIP are normally polyurethane (PUR) foam, expanded polystyrene (EPS) foam, extruded polystyrene (XPS) foam, silica gels, aerogels, fumed silica, glass fibres, polymer beds, perlite, etc. which are believed to be rigid to provide strength to support the walls and have lower thermal conductivity $\lambda_s$. Under fully evacuated, in microporous structure, heat convection and radiation in VIP are considered to be negligible.

In practical application, it is difficult to maintain vacuum in a VIP. A lot of efforts have been made to improve structure of VIP in last decades. Improvement of VIP is the development of "maintenance of vacuum". Laminated plastic and aluminum sheets, or metal layer with a surface protection layer, can be used as wall materials for VIP, for example, in U.S. Pat. No. 4,444,821 to Young et al, in U.S. Pat. No. 4,529,638 to Yamamoto et al, and in U.S. Pat. No. 8,663,773 to Jang et al. To improve impermeability, dual walls, or two walls, or two bags are used as walls for VIP. For example, in U.S. Pat. No. 4,726,974 to Nowobilski et al, in U.S. Pat. No. 7,449,227 B2 to Echigoya et al, in U.S. Pat. No. 7,517,576 B2 to Echigoya et al, in U.S. Pat. No. 7,968,159 B2 to Feinerman, in U.S. Pat. No. 8,137,784 B2 to Veltkamp, and in U.S. Pat. No. 8,475,893 B2 to Feinerman. Multi-layers of structure of VIP was described in U.S. Pat. No. 8,383,225 B2 to Rotter. Sealing of VIP is important to maintain vacuum, various sealing methods have been developed, for example, in U.S. Pat. No. 8,281,558 B2 to Hiemeyer et al, and in U.S. Pat. No. 8,377,538 B2 to Eberhardt et al.

Getters are used to absorb or adsorb gases (or air) leaked through the walls or offgassed from the core materials. Getter materials include zeolites, activated carbon, quicklime (CaO), for example, in U.S. Pat. No. 7,838,098 B2 to Kim et al, and in U.S. Pat. No. 8,663,773 to Jang et al, and a combination of them, as well as metal-organic frameworks (MOFs), for example in U.S. Pat. No. 5,648,508A to Yaghi, and in U.S. Pat. No. 8,647,417 B2 to Eisenhardt et al.

As described above, a lot of improvements for VIP have been obtained. However, some problems still exist in VIP as high thermal resistance panels for thermal insulation, which are: (1) It is difficult to maintain vacuum for long enough for serving as conventional insulation materials. (2) Materials for walls, core and getter of VIP, and sealing VIP are expensive. (3) It is not possible to cut to sizes to fit the installations. (4) Thermal bridging across the VIP edges increases heat transfer and reduces overall heat resistance. These problems limit the practical application of VIP.

Additional improved and modified structure and mechanism to combine with the improvements addressed above are required to overcome the disadvantages in VIP to develop high resistance panels (HRP).

The following Patents and References are cited:
U.S. Pat. Nos.

| | | |
|---|---|---|
| 4,444,821 | April 1984 | Young et al |
| 4,529,638 | July 1985 | Yamamoto et al |
| 8,663,773 | March 2014 | Jang et al |
| 4,726,974 | February 1988 | Nowobilski et al |
| 7,449,227 B2 | November 2008 | Echigoya et al |
| 7,517,576 B2 | April 2009 | Echigoya et al |
| 7,968,159 B2 | June 2011 | Feinerman |
| 8,137,784 B2 | March 2012 | Veltkamp |
| 8,475,893 B2 | July 2013 | Feinerman |
| 8,383,225 B2 | February 2013 | Rotter |
| 8,281,558 B2 | October 2012 | Hiemeyer et al |
| 8,377,538 B2 | February 2013 | Eberhardt et al |
| 7,838,098 B2 | November 2010 | Kim et al |
| 5,648,508 A | July 1997 | Yaghi |
| 8,647,417 B2 | February 2014 | Eisenhardt et al |

REFERENCES

Carslaw, H. S. and Jaeger, J. C., Conduction of Heat in Solids, Second Edition, 1959, Oxford University Press, Reprinted 2000.

Tritt, Terry M., Thermal Conductivity: Theory, Properties, and Applications, Kluwer Academic/Plenum Publishers, New York, 2010.

SUMMARY OF THE INVENTION

The object of the present invention is to provide an improved and modified structure and mechanism to resolve the problems in conventional insulation materials and VIP described above. A newly developed mechanism in the present invention is to reduce total kinetic energy of air or gas molecules in voids in conventional insulation materials and VIP by spatial continuous infinite structures of phononic cocrystals, as defined in the present invention, in which continuous infinite and infinitesimal voids exist. And the elimination in heat radiation is reached by low emissivity of material surfaces. This constructs High Resistance Panels (HRP), which is comprised of low emissivity of surfaces, support materials in between the surfaces, and phononic cocrystals which are distributed on the low emissivity of surfaces, or mixed in support materials or on surfaces of support materials. The structure of support materials is in a honeycomb structure instead of powders or fibres as in conventional insulation materials and VIP. Several HRP can stack together to meet the requirements of thickness and thermal resistance in application. HRP can reach a low overall thermal conductivity comparable to VIP.

Figure 1:
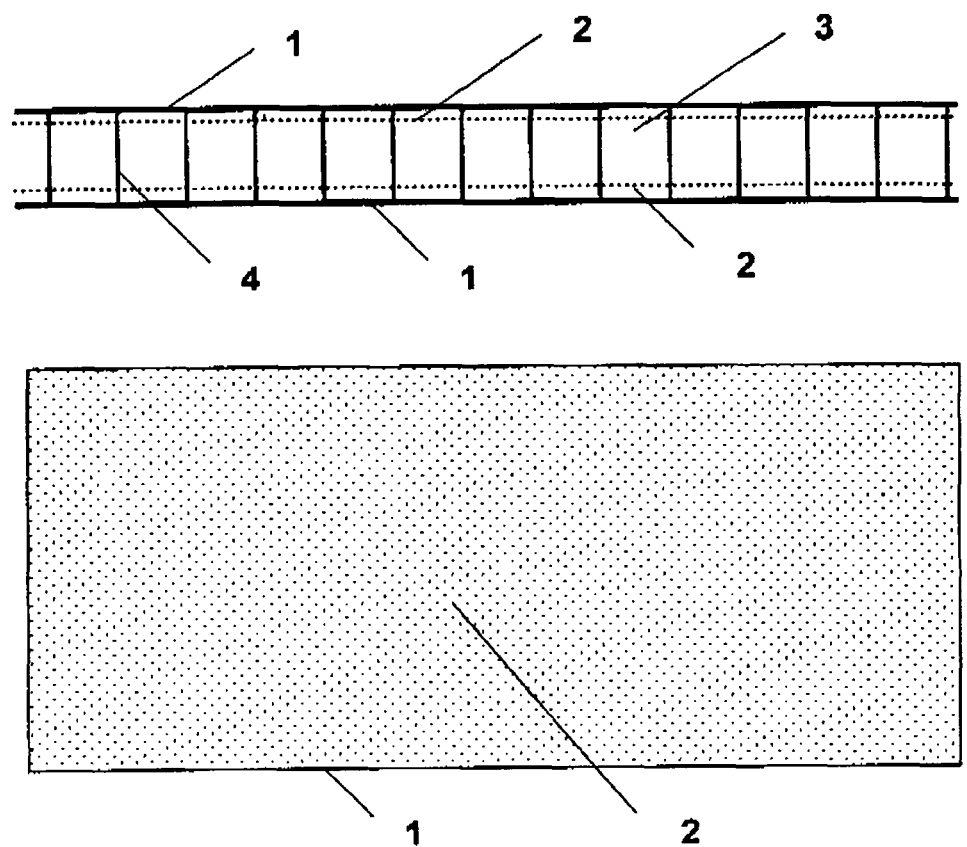
FIG. 1 is a diagrammatic structure of HRP in the invention.

1. Impermeable barrier and backing 2. Surface of low emissivity coated with "phononic cocrystals" defined in the present invention. 3. Cell spaces in support materials. 4. Support materials. 5. Impermeable barrier.

DETAILED DESCRIPTION OF THE INVENTION

VIP can provide low thermal conductivity for insulation. The keys in VIP are vacuum technology and microporous structure. Vacuum is a space that is devoid of matters, or a region with a gaseous pressure less than atmospheric pressure. In practice, the vacuum is partial vacuum. Less air molecules in voids of core materials of VIP eliminates heat conduction and convection by reduction in total kinetic energy of air molecules, or increase in the mean free path of air molecules (more space for molecules), therefore less collisions between air molecules. Heat transfer by radiation can be eliminated by micro scale of voids in VIP with microporous structure, provided that the sizes of voids are less than the mean free path of photons.

In the present invention, the reduction in total kinetic energy of air or gas molecules is obtained by spatial continuous infinite structures of "phononic cocrystals", as defined in the present invention, in which continuous infinite and infinitesimal voids exist. And the elimination in heat radiation is reached by low emissivity of material surfaces.

Cocrystal is a crystalline structure made up of two or more components, where each component is defined as either an ion, an atom, or a molecule to form a joint super lattice, by a definite stoichiometric ratio between the components as each pure component has its own distinct bulk lattice arrangement. This includes many types of compounds, such as hydrates, solvates, clathrates, and eutectics, which represent the basic principle of host-guest chemistry. Spatial continuous infinite different structures of cocrystals are a mixture comprised of infinite different structures of cocrystals. The spatial continuity is defined to be as in an atomic or molecular level in stoichiometric ratio between different pure cocrystals. The "different structures" means that contiguous cocrystals are completely different in structures. In spatial continuous infinite structures of cocrystals there are very small voids between super lattices. The sizes of the voids are less than the mean free path of phonons. For convenient description, the cocrystals are named as "phononic cocrystals" or "phononic eutectics", or "photonic cocrystals". "Phononic cocrystals" represents all the names used in the context. It is shown from theory of thermal conductivity of matters that phonons can be scattered by crystal defects which reduce the thermal conductivity of crystals because the defects produce local variations of sound velocity through change in density or elastic constants. The defects in the phononic cocrystals provided by the voids greatly reduce the thermal conductivity to a very low level. The charge-acceleration and dipole oscillation by kinetic interactions among particles in the phononic cocrystals result in the electrodynamic generation of coupled electric and magnetic fields, which propagate as waves around the space surrounding the phononic cocrystals, and interfere with the matters (air or gases) in the space, reducing their total kinetic energy, and then resulting in a reduction in heat transfer.

Heat radiation from a material through a space larger than optical depth is greatly related to the emissivity of material surfaces. A low emissivity of surface can eliminate heat transfer by radiation. Surface of foils of aluminum or its alloys has emissivity of 0.03 which is much less than most materials used for insulation. Surface of silver has a lower emissivity of 0.02-0.03 but silver is much more expensive.

HRP in the invention overcomes the disadvantages of conventional insulation materials and VIP. HRP mainly includes the following improvements and modifications: (1) Phononic cocrystals provide a low thermal conductivity. (2) Reduction in kinetic energy of air or gas molecules in the spaces of support materials by the phononic cocrystals results in reduction in heat transfer. (3) Low emissivity of surfaces reduces heat transfer by radiation. (4) HRP can be cut to any sizes to meet requirements of installation. (4) No thermal bridging on edges. (5) HRP can stack or pile up to a thickness to meet requirements of installation and heat resistance.

One embodiment of the present invention is shown in FIG. 1. A HRP consists of two impermeable barriers and backings 1, two surfaces 2 with a low emissivity facing each other in direction of heat transfer and coated with phononic cocrystals, support materials 4 for a structure and cell spaces 3.

The materials for impermeable barrier and backing can be aluminum foils, metallised films which are polymer films coated with a thin layer of metal usually aluminum, metal plates, plastics laminated with metal films or by a means of deposition or coating, having very high impermeability and sufficient strength. Low emissivity of surfaces can be provided by aluminum foils or metallised films. The phononic cocrystals are mixed with a clear and transparent adhesive and coated on the surfaces. The adhesive can be glues made from polyvinyl acetate, hot melt adhesives, or pressure-sensitive adhesives. The adhesive also performs as a binder to glue the support materials to the surfaces. The support materials are natural fibres, glass fibres, rock wool, plastics, and other inorganic materials, and their mixtures, and made to form sheets, for example, paper sheets and the like, and then from sheets to form a honeycomb structure using the methods in the prior art. After sufficient strength has been considered, the thinner the sheets, the less heat transfer through the sheets.

Figure 2:
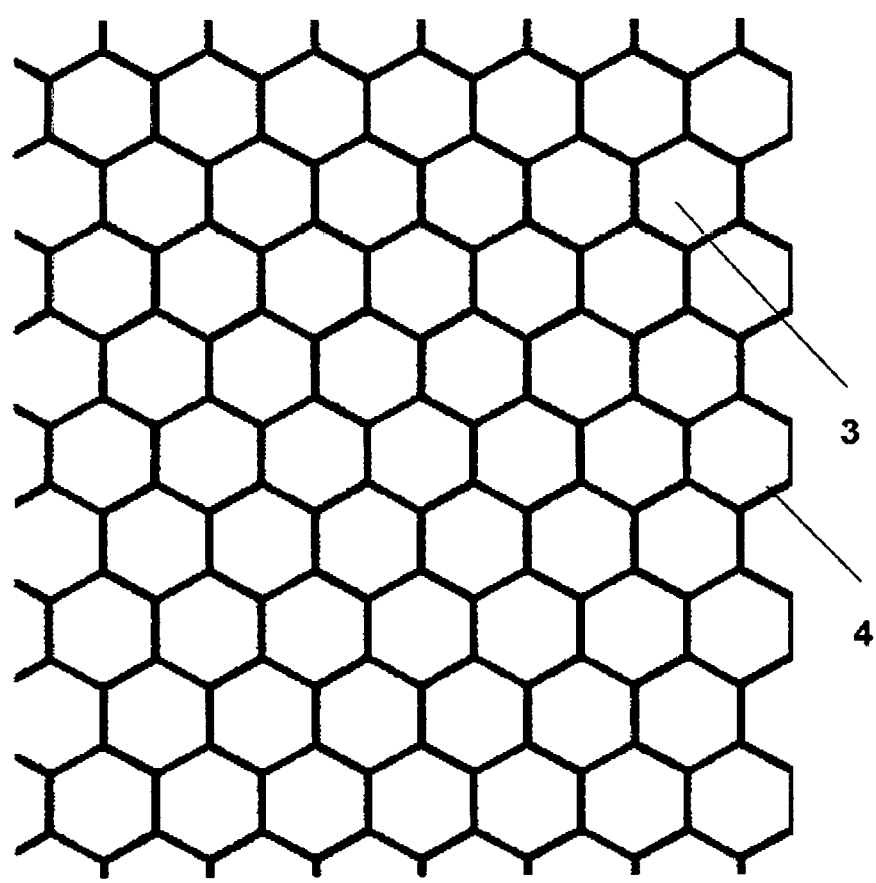
FIG. 2 is a diagrammatic sketch showing one of the structures (hexagonal honeycomb structure) for support materials of HRP in the invention.
Figure 3:
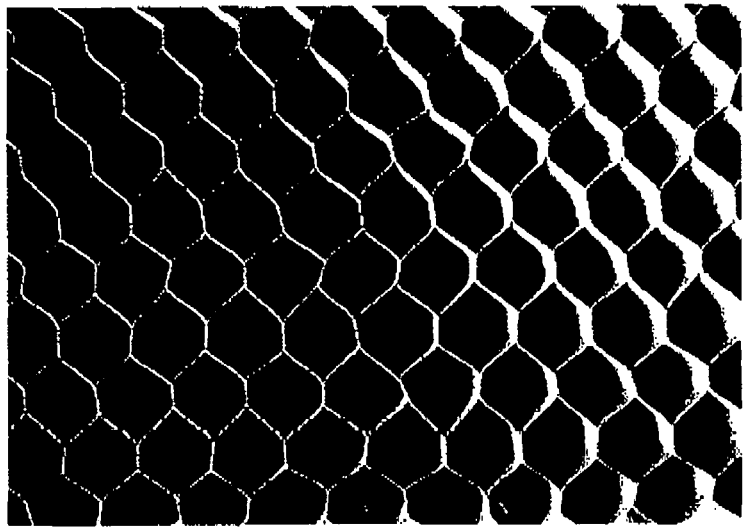
FIG. 3 is a photograph of one of the structures (hexagonal honeycomb structure) for support materials of HRP in the invention.
Figure 4:
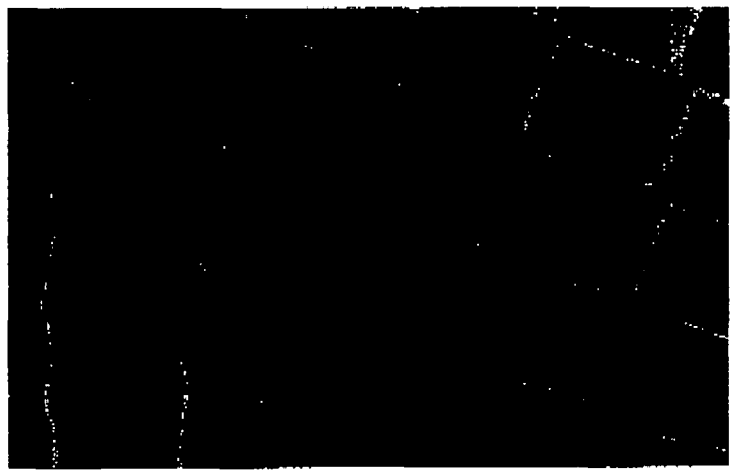
FIG. 4 is a photograph of one of the structures (regular cubic honeycomb structure) for support materials of HRP in the invention.

Honeycomb structures allow the minimization of the amount of support materials to reach minimal weight and maximum strength. A hexagonal honeycomb structure for support materials of HRP in the invention is shown in FIG. 2 and FIG. 3. A regular cubic honeycomb structure is shown in FIG. 4.

The phononic cocrystals by the definition in the invention are a mixture of spatial continuous infinite different structures of cocrystals.

The phononic cocrystals can be constituted from salt hydrates and fusion (melting) temperature-depressing salts that are generally non-hydrated salts in a high viscosity of polymer solution. A simple method and process are described as follows: (1) Mixing a salt hydrate with a fusion (melting) temperature-depressing salt at a ratio in a polymer solution. (2) Heating the solution to a temperature at which the salt hydrate and the fusion (melting) temperature-depressing salt melt completely. (3) Then gradually cooling the mixture without agitation to form the cocrystals. The high viscosity in the solution plays an important role in the process. The formation of phononic cocrystals in the process is induced by the spatial difference of ion concentrations in the solution with high viscosity. When the mixture is being cooled, a eutectic in a space is formed and the ions in the surrounding are being consumed. A different eutectic will be formed in the adjacent space, because the high viscosity reduces the ions to migrate to the space.

The phononic cocrystals can also be formed from molten salts with different melting temperatures. The low melting point of salt provides high viscosity when heated to a molten status. The other salts with high melting points as powders are distributed in the molten salt. The mixture is heated to melt, then is gradually cooled without agitation to form phononic cocrystals.

Furthermore, the phononic cocrystals can be formed from metal oxides during oxidation and water soluble salts where water acts as a catalyst. A simple example is that iron oxides from the oxidation of iron and sodium chloride constitute phononic cocrystals. Saturated solution of sodium chloride is mixed with iron powders and exposed to air or oxygen for oxidation while it is being cooled. The iron oxides formed absorb water, and sodium chloride crystals are seeded out with iron oxides to form eutectics. Due to the concentration gradients of sodium chloride spatially in the mixture, different eutectics are formed. In this process, the oxidation consumes oxygen in air. If the closed cells are formed by support materials, the absence of oxygen in air can produce partial vacuum in the cells, resulting in a reduction in total kinetic energy of air.

The phononic cocrystals formed from the processes described above are not perfect because they are greatly dependent on the control of formation conditions. The perfect phononic cocrystals can be made by modern nano technology.

The quantity of phononic cocrystals in HRP, coated on surfaces or mixed with support materials, depends on the structure and volume of honeycomb cells by the support materials. The thickness of HRP depends on the sizes of honeycomb structures, thickness and strength of sheets made from support materials, and strength requirement for the application. It is suggested that 0.2 mg to 2 mg of phononic cocrystals per cubic centimeter of total volume of HRP be appropriate for the purpose, preferably 0.5 mg to 1.5 mg. The thickness of HRP (in heat transfer direction) can be 1 mm to 60 mm, preferably 3 to 15 mm. The thickness of sheets made from support materials can be in a range of 0.02 mm to 2 mm, preferably 0.05 mm to 1 mm. The area of each honeycomb cell, perpendicular to heat transfer direction, can be in a range of 0.1 $mm^2$ to $1\times10^6$ $mm^2$, preferably 1 $mm^2$ to $1\times10^3$ $mm^2$. The volume of a cell in honeycomb structure made from support materials can be 0.1 $mm^3$ to $10^6$ $mm^3$, preferably 0.5 $mm^3$ to $1\times10^5$ $mm^3$.

Figure 5:
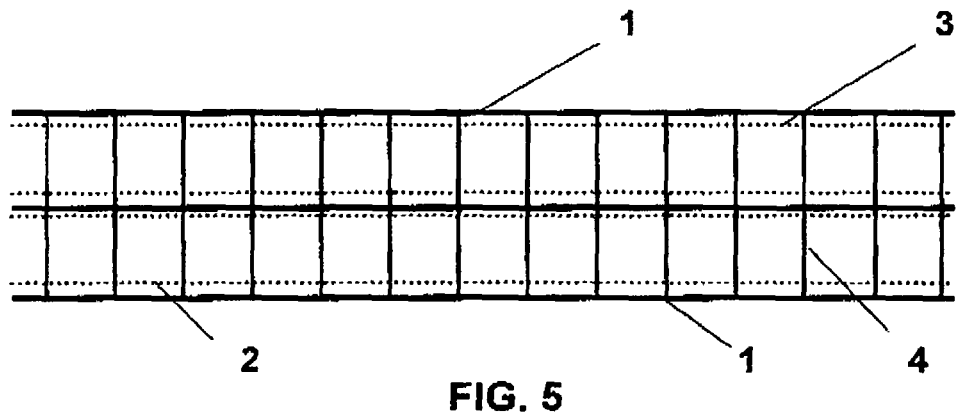
FIG. 5 is a diagrammatic structure of two layers of HRP in the invention.
Figure 6:
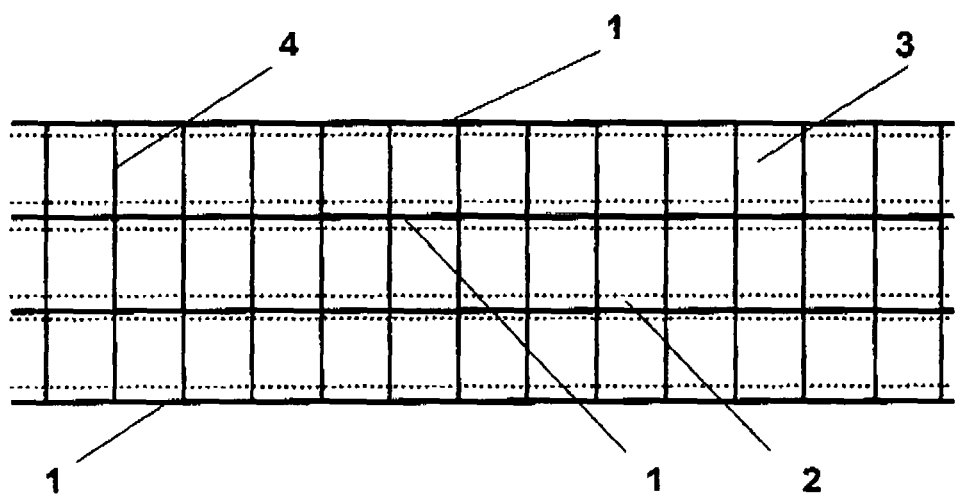
FIG. 6 is a diagrammatic structure of three layers of HRP in the invention.

Two or more HRP can be stacked or piled up to form a thickness to meet requirements for installation and heat resistance. FIG. 5 shows two layers of HRP stack, and FIG. 6 shows three layers of HRP stack. The impermeable barrier 5 between two HRP can serve the both.

HRP in the present invention performs a low thermal conductivity that is in the order of $10^{-3}$ w/(m·K), thus providing high thermal resistance for insulation. HRP overcomes the disadvantages in VIP and conventional insulation materials, and can be made easily and at a low cost. HRP has a low density of 20-100 $kg/m^3$, and can be cut to any sizes to meet requirements for installation.

What is claimed is:

1. A high resistance panel for thermal insulation consisting of
a support material having a first side and a second side opposite to the first side, wherein the support material is a honeycomb structure, and the cells of the honeycomb structure extend between the first side and the second side, substantially perpendicular to the first side and the second side;
first phononic cocrystals located at the first side and second phononic cocrystals located at the second side;
a first impermeable barrier and backing at the first side and a second impermeable barrier and backing at the second side, wherein each of the first impermeable barrier and backing and the second impermeable barrier and backing has a surface of low emissivity of less than 0.03;
a first adhesive mixed with at least a portion of the first phononic cocrystals at the first side, which bonds the first impermeable barrier and backing to the first side, and a second adhesive mixed with at least a portion of the second phononic cocrystals at the second side, which bonds the second impermeable barrier and backing to the second side.

2. A high resistance panel according to claim 1 wherein the impermeable barrier and backings are aluminum foils.

3. A high resistance panel according to claim 1 wherein the impermeable barrier and backings are metal plates.

4. A high resistance panel according to claim 1 wherein the surfaces of low emissivity are provided by aluminum foils.

5. A high resistance panel according to claim 1 wherein the first and second adhesives are clear and transparent glues of polyvinyl acetate.

6. A high resistance panel according to claim 1 wherein the first and second adhesives are hot melt adhesives.

7. A high resistance panel according to claim 1 wherein the first and second adhesives are pressure sensitive adhesives.

8. A high resistance panel according to claim 1 wherein the first and second phononic cocrystals are constituted from salt hydrates and fusion temperature-depressing salts.

9. A high resistance panel according to claim 1 wherein a total amount of the first phononic cocrystals and the second phononic cocrystals is 0.2 mg to 2 mg per cubic centimeter of the high resistance panel.

10. A high resistance panel according to claim 1 wherein the first phononic cocrystals at the first side are coated on surfaces of the honeycomb structure at the first side, and the second phononic cocrystals at the second side are coated on surfaces of the honeycomb structure at the second side.

11. A high resistance panel according to claim 1 wherein the thickness of the panel is 1 mm to 60 mm.

12. A high resistance panel according to claim 1 wherein the support material is paper.

13. A high resistance panel according to claim 1 wherein the honeycomb structure is made from sheets.

14. A high resistance panel according to claim 13 wherein the sheets have a thickness of 0.02 mm to 2 mm.

15. A high resistance panel according to claim 1 wherein the cross-sectional area of each honeycomb cell in a direction perpendicular to the longitudinal axis of each cell is 0.1 $mm^2$ to $1\times10^6$ $mm^2$.

16. A high resistance panel according to claim 1 wherein the volume of each cell in the honeycomb structure is 0.1 mm$^3$ to 10$^6$ mm$^3$.

\* \* \* \* \*